United States Patent [19]

Hein

[11] Patent Number: 5,598,159
[45] Date of Patent: Jan. 28, 1997

[54] METHOD FOR THE FAST DECODING OF THE OUTPUT SIGNALS OF SIGMA DELTA MODULATORS

[75] Inventor: Soeren Hein, Munich, Germany

[73] Assignee: Siemens Aktiengesellschaft, Munich, Germany

[21] Appl. No.: 378,256

[22] Filed: Jan. 24, 1995

[30] Foreign Application Priority Data

Jan. 24, 1994 [DE] Germany .................. 44 01 883.5

[51] Int. Cl.⁶ ............................................. H03M 3/00
[52] U.S. Cl. ............................................... 341/143
[58] Field of Search ................................... 341/143

[56] References Cited

U.S. PATENT DOCUMENTS 5,164,727 11/1992 Zakhor ................................... 341/143
5,493,297 2/1996 Nguyen et al. ....................... 341/143

Primary Examiner—Howard L. Williams
Attorney, Agent, or Firm—Hill, Steadman & Simpson

[57] ABSTRACT

In a method for fast decoding of the output signals of sigma delta modulators, the decoded output signal of a modulator is acquired using a sequence of iteration steps. In each step, two operations $P_1$ or, respectively, $P_2$ are thereby successively implemented, whereby the signals s are presented by components $s(n)$, $s(n-1)$, $s(n-2)$, ..., $s(n-k)$ that are temporal samples of these signals. The operation $P_1$ is a projection in the space of all input signals of the modulator onto the set of all of those input signals that the modulator images onto the output signal to be decoded. The operation $P_2$ is a projection onto the sub-space of all band-limited input signals of the modulator. A presentation of the signals is selected for both operations wherein the operation $P_1$ can be implemented component-by-component. This method is substantially faster ($10^4$–$10^5$) than all known methods for decoding the output signals of sigma delta modulators with comparable precision and is only 2–10 times slower than substantially more imprecise, linear decoding methods. It can be employed in conjunction with all standard sigma delta architectures.

14 Claims, 2 Drawing Sheets

METHOD FOR THE FAST DECODING OF THE OUTPUT SIGNALS OF SIGMA DELTA MODULATORS

BACKGROUND OF THE INVENTION

The present invention is directed to a method for fast decoding of output signals of sigma delta modulators, i.e. for fast generation of a high-resolution digital code with normal sampling frequency from a temporally highly over-sampled code having far lower resolution, whereby both codes approximate a temporally sampled, analog signal in digital form. The input signal of a sigma delta modulator is utilized for analog-to-digital conversion.

Sigma delta modulators (J. C. Candy et al. (Eds.), *Oversampling Sigma Delta Converters*. New York: IEEE Press, 1991.) are simple, highly non-linear circuits that can be used for analog-to-digital conversion, for example for voice or audio signals in audio technology, but which can also be used in many other areas of information and communication technology such as, for example, in communications technology. They can be very cost-beneficially manufactured with the simple processes standard for digital circuits and can be integrated on a chip together with digital circuits. High-precision and, thus, expensive components are not required for building them. The required high resolution is instead achieved by an increased clock rate in combination with a closed, self-correcting, feedback signal loop according to the principle of difference pulse code modulation (DPCM).

An analog input signal that is temporally sampled far above the Nyquist frequency is converted by a sigma delta modulator into an extremely roughly quantized, and extremely over-sampled output signal. The quantization is normally single-stage, so that the output signal of the modulator is binary in the typical case. This binary, extremely over-sampled signal must now be converted into a high-resolution signal, i.e. into a digital signal having a greater word width of, for example, 16 bits which, however, dare have only a substantially lower sampling frequency instead. This procedure is also referred to as decoding.

The conventional methods for decoding the output signals of sigma delta modulators that are based on linear filtering (A. V. Oppenheim and R. W. Schafer, *Discrete-Time Signal Processing*, Prentice Hall: Englewood Cliffs, N.J., 1989) are not able to extract all of the relevant information from the output signal. These methods only use the limitation of the spectrum of the analog input signal to a specific band, but make no use of the specific type of bit-by-bit, sequential generation of the binary data stream by the modulator, i.e. of the relationship between the input signal and the output signal established by the architecture of the modulator. For this reason, the results of these conventional methods based on linear filtering involve errors in the form of too poor a signal-to-noise ratio that can frequently not be tolerated.

Hein and Zakhor describe a non-linear method for decoding sigma delta modulators (S. Hein and A. Zakhor, *Sigma Delta Modulators: Nonlinear Decoding Algorithms and Stability Analysis*, Kluwer Academic Publishers, 1993, S. Hein and A. Zakhor. *Optimal Decoding for Data Acquisition Applications of Sigma Delta Modulators*, U.S. Pat. No. 5,164,727, Nov. 17, 1992.) with which a substantially improved signal-to-noise ratio can be achieved. This method is based on an alternating iteration $$x_{n+1}=P_2(P_1(x_n))$$

using the assistance of two projections $P_1$ and $P_2$ onto two convex sub-sets of signal spaces, whereby the one sub-set covers those analog input signals of the modulator that generate the binary data stream to be decoded as output signal, and whereby the other sub-set is equal to the space of all band-limited signals that, for example, is spanned by a set of band-limited base signals. The alternating iteration converges toward a fixed point that belongs to the intersection set of the two convex sub-sets. This fixed point signal, consequently, is the sought digital correspondent of that band-limited, analog input signal of the modulator that generates the binary data stream to be decoded as output signal.

The non-linear method described in the Hein and Zakhor reference is thus fundamentally superior to the conventional, linear approach because it employs not only the spectral properties of the input signal for decoding but additionally makes use of the relationship between the input signal and the output signal established by the architecture of the modulator. Unfortunately, this method involves a disproportionally high calculating outlay and is thereby too expensive and too slow, as a result whereof the practical employment thereof is highly limited for decoding sigma delta modulators that can be realized with an especially simple and, therefore, cost-beneficial circuits.

SUMMARY OF THE INVENTION

The present invention is therefore based on the object of providing a method for fast decoding of the output signals of sigma delta modulators that requires substantially reduced calculating outlay for implementation and is thereby just as exact as the nonlinear method described in the Hein and Zakhor reference at the same time.

This object is inventively achieved by a method for fast decoding of the output signals of sigma delta modulators comprising the following features of Claim 1. The decoded output signal of a modulator is acquired with the assistance of a sequence $x_{n+1}=P_2(P_1(x_n))$ of iteration steps, whereby $x_0$ is a predetermined start signal, i.e. two operations $P_1$ or, respectively, $P_2$ are successively executed in every step, whereby the signals s are presented by components $s(n)$, $s(n-1)$, $s(n-2)$, ..., $s(n-k)$ that are temporal samples of these signals. The operation $P_1$ is thereby a projection in the space of all input signals of the modulator onto the set of all of those input signals that the modulator maps into the output signal to be decoded. The operation $P_2$ is a projection onto the sub-space of all input signals of the modulator whose frequency spectrum is limited in a predetermined way, whereby a presentation of the signals is selected for both operations wherein the operation $P_1$ can be implemented component-by-component, so that each component $P_1(s)(k)$ of $P_1(s)$ is calculated separately from all other components $P_1(s)(k')$ with $k' \neq k$.

As a result of this component-by-component implementation of the operation $P_1$, the calculating outlay for the implementation of the method of the present invention is so decisively reduced in comparison to the known method that the method of the present invention is suitable without further ado for commercial employment for decoding the output signals of sigma delta modulators. The method is substantially faster ($10^4$–$10^5$ times) than all known methods for decoding the output signals of sigma delta modulators having comparable precision and is only 2–10 times slower than substantially less precise, linear decoding methods. It can be employed in conjunction with all standard sigma delta architectures.

Advantageous developments of the present invention are as follows.

In a preferred embodiment of the method of the present invention, the operation $P_1$ is implemented according to the rule $$P_1(x_n)(k) = \begin{bmatrix} x_n(k) \text{ when } y(k) \cdot x_n(k) \leq y(k) \cdot (Hy)(k) \\ (Hy)(k) \text{ otherwise} \end{bmatrix},$$

whereby y is the binary vector $y=(y(0), \ldots, y(N-1))$ of the output signal of the modulator to be decoded and $$H = \begin{bmatrix} h_1 & 0 & \ldots & 0 & 0 \\ h_2 & h_1 & \ldots & 0 & 0 \\ \cdot & \cdot & & \cdot & \cdot \\ \cdot & \cdot & & \cdot & \cdot \\ \cdot & \cdot & & \cdot & \cdot \\ h_{N-1} & h_{N-2} & \ldots & h_1 & 0 \\ h_N & h_{N-1} & \ldots & h_2 & h_1 \end{bmatrix}$$

is the matrix of the impulse response coefficients of the linear filter embedded into the non-linear feedback loop of the modulator (for example, FIG. 1). In this embodiment, the output signal y to be decoded is transformed with the assistance of the matrix H into a presentation wherein the operation $P_1$ can be implemented component-by-component. Since the signal vector x is thereby likewise present in a presentation that leads onto the image of the output signal to be decoded under the matrix H, i.e. lies in the image region of H, the orthogonal projections $P_2$ must likewise be implemented such that they project a signal s onto the image of the sub-space of the band-limited signal under the matrix H.

A further preferred exemplary embodiment of the method of the present invention therefore provides that the operation $P_2$ should be equivalent to the expression $$P_2(s) = \sum_i Hb_i \cdot (b|H^THb)_{i,j}^{-1} \cdot (Hb_j|s),$$

whereby the vectors $b_i=(b_i(0), \ldots, b_i(N-1))$ indicate base signals of a sub-space of band-limited signals in the space of all input signals of the modulator, H indicates the matrix of the impulse response coefficients of the linear filter embedded into the non-linear feedback loop of the modulator (for example, FIG. 1), (|) indicates the Euclidean scalar product on the space of the signal vectors and $(b|H^THb)_{i,j}^{-1}$ indicates the coefficients of the inverse matrix of the scalar products $(b_q|H^THb_r)$.

The convergence of the above-described iteration, further, can be substantially accelerated in that a modified iteration having the form $x_{n+1}=P_2(P_1(\alpha \cdot x_n+(1-\alpha) \cdot x_{n-1}))$ is employed in a preferred embodiment of the invention, whereby the parameter $\alpha$ is optimally selected in the execution of the operation $P_1$. A further acceleration of the method which, however, involves a possible loss in precision, can be achieved in that a temporally under-sampled output signal of the modulator is decoded. This under-sampling of the output signal can be especially advantageously controlled by the quantization error of the modulator.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 5b shows the inverse filter of the filter shown in FIG. 5a.

DETAILED DESCRIPTION OF THE PRESENTLY PREFERRED EMBODIMENTS

Figure 1:
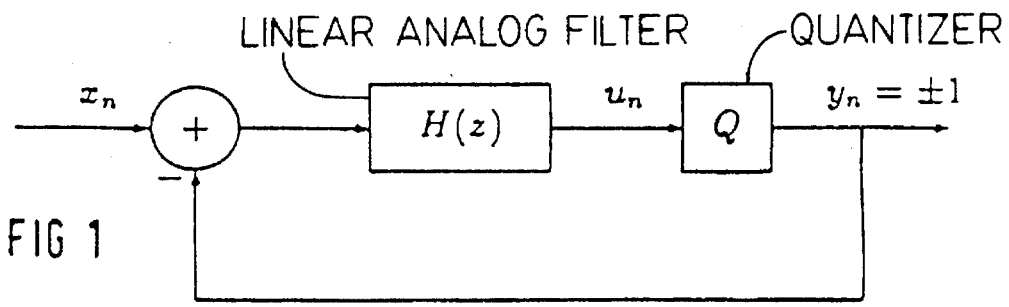
FIG. 1 shows a temporally discrete model of an interpolative sigma delta modulator.

FIG. 1 schematically shows a general interpolative sigma delta modulator. It is composed of a temporally discrete, linear analog filter H(z) that is embedded into a nonlinear loop having negative feedback. The non-linear element in the loop is a quantizer Q whose resolution typically amounts to 1 bit. The method of the present invention, however, is not limited to modulators having single-stage quantization, and a person skilled in the art is in the position on the basis of the general knowledge available to him of modifying the method presented herein for the case of single-stage quantization such that it can be applied to the multi-stage case.

Figure 2:
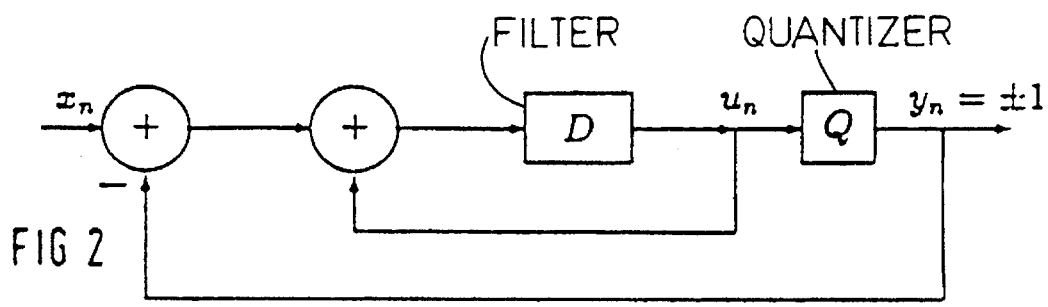
FIG. 2 shows a temporally discrete model of a sigma delta modulator having a feedback loop.
Figure 3:
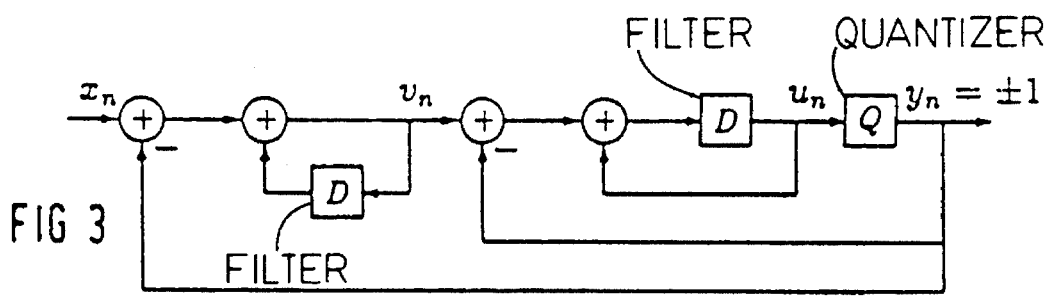
FIG. 3 shows a temporally discrete model of a sigma delta modulator having a double feedback loop.
Figure 4:
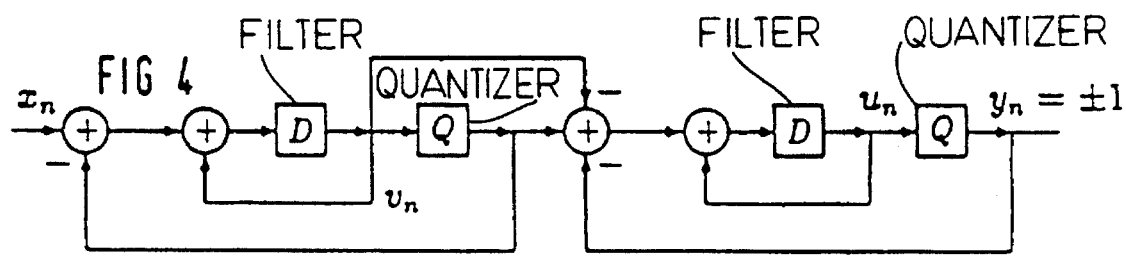
FIG. 4 shows a temporally discrete module of a two-stage sigma delta modulator.
Figure 5A:
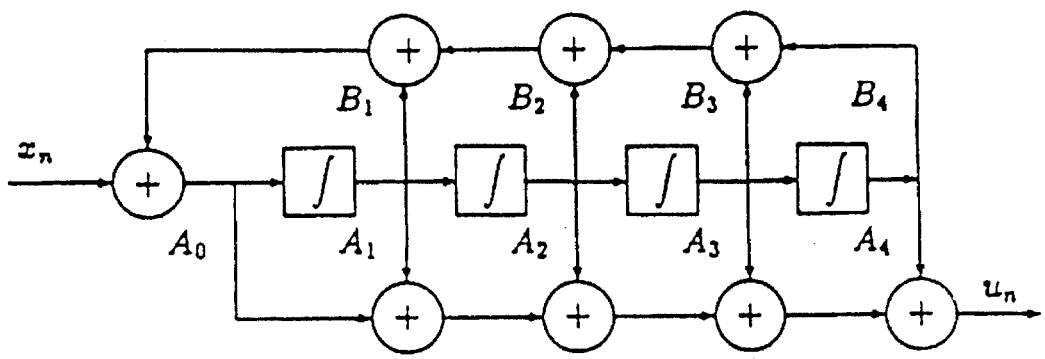
FIG. 5a shows a filter of the fourth order.
Figure 5B:
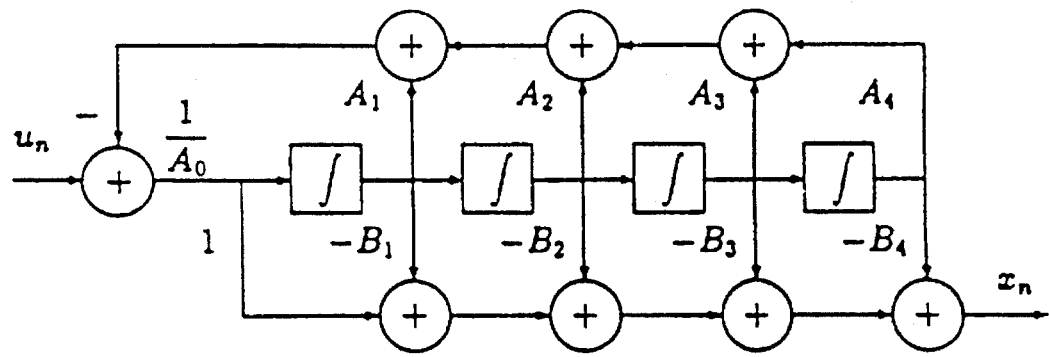

The single-stage quantizer is described by the relationship $$Q(u) = \begin{bmatrix} +1 \text{ when } u > 0 \\ -1 \text{ when } u \leq 0 \end{bmatrix}$$

for reasons of clarity, the method of the present invention shall be described herein only for what is referred to as an interpolative modulator because a person skilled in the art is in the position on the basis of the general knowledge available to him of modifying the method for any other arbitrary modulator architectures. A single-loop modulator according to FIG. 2 is a special case of the general interpolative modulator having $H(z)=z^{31}\ ^1/(1-z^{31}\ ^1)$. The two-loop modulator shown in FIG. 3 and the two-stage modulator in FIG. 4 are non-interpolative. The method disclosed herein, however, can be easily applied to these modulators, for example using the methods presented in the Hein and Zakhor reference. Filters of a higher order such as shown, for example, in FIGS. 5a and 5b can likewise be employed.

The method of the present invention is based on the idea that the sought, decoded output signal must satisfy two conditions:

1. It must be band-limited.
2. It must belong to the set of those input signals of the modulator that are converted by the modulator into the output signal to be decoded.

The first condition is also utilized by the known, linear decoding methods that are essentially composed of a low-pass or band-pass filtering. The second condition makes use of the specific architecture of the modulator whose output signal is to be decoded. The Hein and Zakhor reference discloses a method that is fundamentally suitable for considering both conditions:

This method is based on an alternating iteration $x_{n+1}=P_2(P_1(x_n))$ using two projections $P_1$ and $P_2$ onto two convex sub-sets of signal spaces, whereby the one sub-set covers those analog input signals of the modulator that generate the binary data stream to be decoded as output signal, and whereby the other sub-set is equal to the space of all band-limited signals that, for example, is spanned by a set of band-limited basis signals. The alternating iteration consequently converges toward a fixed point that belongs to the intersection set of both convex sub-sets. This fixed point signal, consequently, is the sought digital correspondent of that band-limited analog input signal of the modulator that generates the binary data stream to be decoded as output signal, The non-linear method described in the Hein and Zakhor reference is thus fundamentally superior to the conventional, linear approach because it employs not only the spectral properties of the input signal for decoding but additionally makes use of the relationship between the input signal and the output signal established by the architecture of the modulator. Unfortunately, this method involves a disproportionally high calculating outlay and is thereby too expensive and too slow. As a result, the practical employment thereof is highly limited for decoding sigma delta modulators that can be realized with especially simple and, therefore, cost-beneficial circuits.

In the method disclosed in the Hein and Zakhor reference, the non-linear projection $P_1$ of a vector x is implemented in that a vector x' is sought whose Euclidean spacing $$\sum_k (x'(k) - x(k))^2$$

from x is minimal under the secondary condition $(QHx')(k) \leq (QHy)(k)$, whereby the matrix $Q=\text{diag}(y_1, \ldots, y_N)$ defines the operational sign of the inequalities, and the inequality sign between vecotrs is to be interpreted coordinate-wise, and $$H = \begin{bmatrix} h_1 & 0 & \ldots & 0 & 0 \\ h_2 & h_1 & \ldots & 0 & 0 \\ . & . & & . & . \\ . & . & & . & . \\ . & . & & . & . \\ h_{N-1} & h_{N-2} & \ldots & h_1 & 0 \\ h_N & h_{N-1} & \ldots & h_2 & h_1 \end{bmatrix}$$

The matrix H is established by the impulse response coefficients of the linear filter in the modulator loop. As is standard in digital signal processing, signals are represented by vectors whose components represent temporal samples. A person skilled in the art immediately sees that the search of this vector x' cannot be implemented component-by-component even though the inequality secondary conditions may be read component-by-component since the non-diagonal matrix H couples the components of the vector x to one another.

This coupling is the cause of the high calculating outlay that the method disclosed in the Hein and Zakhor reference involves. The present invention alleviates this situation in that a presentation is selected for the vectors x wherein the multiplication with the matrix H has already been implemented. The secondary conditions thus assume the form $(Qx'_H)(k) \leq (QHy)(k)$ where $x'_H = Hx'$, and the subscript "H" is defined for vectors in general as denoting a pre-multiplication by the matrix H.

The minimization of the Euclidean spacing $$\sum_k (x'_H(k) - x_H(k))^2$$

can now be easily implemented component-by-component in this form. In the case of the interpolative modulator, the non-linear projection operator therefore receives the simple form $$P_1(x_n)(k) = \begin{bmatrix} x_n(k) \text{ when } y(k) \cdot x_n(k) \leq y(k) \cdot (Hy)(k) \\ (Hy)(k) \text{ otherwise} \end{bmatrix},$$

whose component-by-component structure can be immediately seen. In this equation, as in the following text, the index H of the signal vector x is in turn not shown for reasons of clarity. It must be taken into consideration, however, that the iteration $x_{n+1}=P_2(P_1(x_n))$ now no longer directly converges toward the sought, decoded output signal of the modulator but converges toward the image of this decoded output signal under the matrix H. The vector x must therefore be multiplied with the inverse of the matrix H at the end of the iteration in order to obtain the decoded output signal of the modulator. This, for example, can advantageously occur by filtering with the filter inverse relative to H (for example, FIG. 5b).

Since all vectors of the iteration method are now present in a presentation that proceeds from the standard presentation of the signal vectors by a multiplication with the matrix H, the projection $P_2$ onto the sub-space of the band-limited input signals must also be implemented in this presentation. Where a projection operator that was equivalent to the form $$P_2(s) = \sum_i b_i \cdot (b|b)^{-1}_{i,j} \cdot (b_j|s),$$

was employed in the standard presentation, then a projection operator can now be employed that is equivalent to the form $$P_2(s) = \sum_i Hb_i \cdot (b|H^T Hb)^{-1}_{i,j} \cdot (Hb_j|s),$$

i.e. projects orthogonally onto the sub-space of the base signals $b_i=(b_i(1), \ldots, b_i(N))$ of the band-limited sub-space multiplied by H. The symbol (|) is thereby the Euclidean scalar product $(a|b) = a^T b = \sum_k a(k)b(k)$ on the space of the signal vectors and $(b|H^T Hb)^{-1}_{i,j}$ indicates the coefficients of the inverse matrix of the scalar products $(b_q|H^T Hb_r)$. It therefore follows that $P_2 P_2 = P_2$ and $P^{2T} = P_2$ are valid, this being necessary and sufficient for an orthogonal projector.

The extremely compact, explicit form of the projection operator is not intended to mean that a matrix inversion would in fact be required for its application. In practice, by contrast, a suitable method will be utilized for orthonormalization of the transformed base signals, for example the standard method of Gram-Schmidt. The calculation of the transformed and orthonormalized base signals is not an operation in any case that would lengthen the calculating time required for the implementation of the method of the present invention. Since these base signals and the matrix H are defined only by the architecture of the modulator and are not dependent on the output signal to be decoded, all necessary calculations for preparing the projection $P_2$ can be implemented once before the implementation of the actual decoding ("off line").

The selection $x_0=y$, i.e. the output signal of the modulator to be decoded itself, is preferably employed as a start vector for the iteration $x_{n+1}=P_2(P_1(x_n))$. As a rule, the selection of the start vector already prevents individual signal components from growing beyond all limits. Fundamentally, however, it is also possible to limit the signals in the implementation of the non-linear projection $P_1$ onto the N-dimensional cube $[-1, +1]^N$.

By contrast to the method disclosed in the Hein and Zakhor reference, the most algorithmically complicated part of the method of the present invention disclosed herein is the implementation of the projection $P_2$ onto the sub-space of the band-limited input signals. It is therefore meaningful in some instances to speed up the method to forego some of the obtainable precision in that some components of the output signal to be decoded are left out of consideration. This corresponds to a chronological under-sampling of the output signal to be decoded, analogous to the decimation in the linear filtering. When the under-sampling factor is suitably selected, taking the sampling theorem (Nyquist frequency) into consideration, this procedure leads only to extremely slight or, respectively, negligible losses in the precision of the decoding.

The under-sampling of the output signal $y=(y(0), \ldots y(N-1))$ to be decoded can be formally described as multiplication by a K×N matrix S whose matrix elements are all 0 except for a single 1 in every row and that selects a K-dimensional sub-vector Sy with (Sy)(k)=y(k) from the N-dimensional signal vector y. The new inequations $$SQx_H=(SQS^T)Sx_H=(SQS^T)x_{SH} \leq SQHy$$

now replace the sub-conditions of the operation $P_1$, $SQS^T$ therein being a K×K diagonal matrix and $Sx_H=x_{SH}$ being a K-dimensional vector. Due to the properties of the matrix these secondary conditions are weaker (i.e., they are fewer in number and significantly fewer under certain circumstances) than the original secondary conditions that are not under-sampled. Correspondingly less time is therefore required for the implementation of the operation $P_1$. The time gain in the implementation of $P_2$, however, is of far greater significance because more calculating operations per component proceeding from x are to be implemented instead for $P_1$. Instead of N summations, only K summations are now to be taken into consideration in the summation $$P_2(s) = \sum_{i=1}^{K} (u_i|s)u_i$$

whereby the vectors $u_i$ are an orthonormal base in the space of the under-sampled, band-limited input signals transformed with H. Such a base can be acquired from the vectors $SHb_i$ using, for example, the method of Gram-Schmidt:

$$g_m = SHb_m - \sum_{i=1}^{m-1} P_{m,i}u_i$$

For the sake of simplicity, the index SH at the signal vector x must again be imagined suppressed for the application of the iteration equations. However, it must be remembered that x is related to the actual, decoded output signal via a multiplication by the matrix SH which must be canceled at the very conclusion following the iteration.

The multiplication by S is canceled, for example, by a development $$x_H = \sum_{m=1}^{N} \beta_m \cdot Hb_m$$

for non-undersampled base signals $Hb_i$. The coefficients $\beta_m$ of this development for the N base signals $b_m$ are related to the coefficients of the development $$x_{SH} = \sum_{i=1}^{K} (u_i|x_{SH}) \cdot u_i$$

of $x_{SH}$ for the K base signals $u_i$ via the relationships $$\beta_m = \frac{1}{n_m} \left( (u_m|x_{SH}) - \sum_{i=m+1}^{M} (SHb_i|u_m) \cdot \beta_i \right) \text{ for } m = M, \ldots, 1$$

as in the case without under-sampling, x is ultimately acquired from $x_H$ by multiplication by the matrix inverse relative to H. The specific structure of H can thereby be advantageously exploited.

Any selection matrix S can be fundamentally employed for under-sampling in conjunction with the disclosed method. A uniform under-sampling dependent on the values of the output signal of the modulator is certainly the simplest. It has the advantage that the matrix S (as well as H) is already known before the decoding, for which reason the orthonormalization of the base-signals can be implemented before the decoding ("off line") and therefore does not lengthen the calculating time of the decoding method.

It is intuitively obvious that the most important samples of the output signal y to be decoded are exactly those whereat the input signal u of the quantizer Q(u) is especially small. Conversely, however, this means that the samples having higher values for u contribute only little to the decoding. These samples are therefore best suited for being eliminated in an under-sampling that is dependent on the values of the output signal. This ensues practically, for example, using a further auxiliary quantizer F that is not necessarily extremely exact and that subjects the absolute value of the input signal u of the main quantizer Q to a threshold formation $$F(u) = \left[ \begin{array}{c} 1 \text{ when } |u| < \epsilon < 1 \\ 0 \text{ otherwise} \end{array} \right]$$

When, for example, the matrix $$S(k,n) = \left[ \begin{array}{c} 1 \text{ when } n \text{ is the } k^{th} \text{ time index that } F(u(m)) = 1 \\ 0 \text{ otherwise} \end{array} \right]$$

is selected for the under-sampling, then an under-sampling pattern dependent on the running signal values is obtained with only minimal influence on the precision of the decoding. Let a small example illustrate this:

$\epsilon = 0.1$

| $n =$ | 1 | 2 | 3 | 4 | 5 | 6 | 7 |
|---|---|---|---|---|---|---|---|
| $u =$ | 0.3 | −0.7 | 0.6 | 0.05 | 0.3 | −0.07 | 0.3 |
| $F(u) =$ | 0 | 0 | 0 | 1 | 0 | 1 | 0 |

$$S = \begin{pmatrix} 0 & 0 & 0 & 1 & 0 & 0 & 0 \\ 0 & 0 & 0 & 0 & 0 & 1 & 0 \end{pmatrix}$$

The price of this selection of a non-regular under-sampling, however, is that the orthonormal base required for the implementation of the operation $P_2$ must now be calculated anew for every output signal to be decoded and, thus, must be calculated over and over again during the ongoing method.

The algorithm of the present invention can be summarized in rough outline as follows: Before the actual decoding, an orthonormal base of base signal functions of the sub-space of the band-limited input signals transformed with the matrix H is calculated. For the actual decoding, the output signal y of the modulator to be decoded is now multiplied by the matrix H. Following thereupon, the iteration steps are implemented—with alternating application of the operators $P_1$ and $P_2$, until convergence occurs. The result of the iteration is multiplied by the matrix that is inverse relative to H. In the case of an under-sampling, the orthonormalization is implemented with the under-sampled, band-limited base vectors. When convergence occurs, the result of the iteration is developed for the original, non-under-sampled base signals and, finally, is multiplied by the matrix that is inverse relative to H.

On the basis of this specification, a person skilled in the art is in the position without further ado to transform the method of the present invention into hardware using suitable electronic circuits. Dependent on his digression, customized circuits, programmable circuits (processors) or both circuit types simultaneously can be utilized. As a result of the great number of possible circuit-orientated realizations of the method of the present invention at the command of a person skilled in the art, even a partial presentation need not be included here.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for fast decoding of output signals of sigma delta modulators comprising the steps of:

acquiring a decoded output signal of a modulator using a sequence $x_{n+1}=P_2(P_1(x_n))$ of iteration steps, whereby $x_0$ is a predetermined start signal;

successively implementing two operations $P_1$ and $P_2$ in each of said iteration steps;

representing signals s by components $s(n)$, $s(n-1)$, $s(n-2)$, ..., $s(n-k)$ that are temporal samples of said signals s;

the operation $P_1$ being a projection in a space of all input signals of the modulator onto a set of all input signals that the modulator images onto an output signal to be decoded;

the operation $P_2$ being a projection onto a sub-space of all input signals of the modulator whose frequency spectrum is limited in a predetermined manner; and selecting a representation of the input signals for both operations wherein the operation $P_1$ is implemented component-by-component, so that each component $P_1(s)(k)$ of $P_1(s)$ is calculated separately from all other components $P_1(s)(k')$ where $k' \neq k$.

2. The method according to claim 1, wherein the modulator has a non-linear feedback loop with an embedded linear filter and wherein the operation $P_1$ is implemented according to the rule $$P_1(x_n)(k) = \begin{bmatrix} x_n(k) \text{ when } y(k) \cdot x_n(k) \leq y(k) \cdot (Hy)(k) \\ (Hy)(k) \text{ otherwise} \end{bmatrix},$$

where y is a vector $y=(y(0),\ldots,y(N-1))$ of the output signal of the modulator to be decoded, and $$H = \begin{bmatrix} h_1 & 0 & \ldots & 0 & 0 \\ h_2 & h_1 & \ldots & 0 & 0 \\ \cdot & \cdot & & \cdot & \cdot \\ \cdot & \cdot & & \cdot & \cdot \\ \cdot & \cdot & & \cdot & \cdot \\ h_{N-1} & h_{N-2} & \ldots & h_1 & 0 \\ h_N & h_{N-1} & \ldots & h_2 & h_1 \end{bmatrix}$$

is a matrix of impulse response coefficients of the liner filter embedded in the non-linear feedback loop of the modulator.

3. The method according to claim 2, wherein the operation $P_2$ is implemented as follows:

$$P_2(s) = \sum_i Hb_i \cdot (b|H^THb)_{i,j}^{-1} \cdot (Hb_j|s),$$

where signal vectors $b_i=(b_i(0),\ldots,b_i(N-1))$ indicate base signals of a sub-space of band-limited signals in a space of all input signals of the modulator, where H indicates a matrix of impulse response coefficients of the linear filter embedded into the non-linear feedback loop of the modulator, where the symbol | indicates a Euclidean scalar product on a space of the signal vectors and where $(b|H^THb)_{i,j}^{-1}$ indicates coefficients of the inverse matrix of scalar products $(b_q|H^THb_r)$.

4. The method according to claim 1 wherein an iteration having the form $x_{n+1}=P_2(P_1(a \cdot x_n+(1-\alpha) \cdot x_{n-1}))$ is employed, the parameter $\alpha$ being optimally or otherwise selected in the implementation of the operation $P_1$.

5. The method according to claim 1 wherein a temporally under-sampled output signal of the modulator is decoded.

6. The method according to claim 5 wherein the under a sampling of the output signal is controlled by a quantization error of the modulator.

7. A method for fast decoding of output signals of a sigma delta modulator having a non-linear feedback loop with an embedded linear filter, comprising the steps of:

acquiring a decoded output signal of a modulator using a sequence $x_{n+1}=P_2(P_1(x_n))$ of iteration steps, whereby $x_0$ is a predetermined start signal;

successively implementing two operations $P_1$ and $P_2$ in each of said iteration steps, the operation $P_1$ as $$P_1(x_n)(k) = \begin{bmatrix} x_n(k) \text{ when } y(k) \cdot x_n(k) \leq y(k) \cdot (Hy)(k) \\ (Hy)(k) \text{ otherwise} \end{bmatrix},$$

where y is a vector $y=(y(0),\ldots,y(N-1))$ of the output signal of the modulator to be decoded, and $$H = \begin{bmatrix} h_1 & 0 & \ldots & 0 & 0 \\ h_2 & h_1 & \ldots & 0 & 0 \\ \cdot & \cdot & & \cdot & \cdot \\ \cdot & \cdot & & \cdot & \cdot \\ \cdot & \cdot & & \cdot & \cdot \\ h_{N-1} & h_{N-2} & \ldots & h_1 & 0 \\ h_N & h_{N-1} & \ldots & h_2 & h_1 \end{bmatrix}$$

is a matrix of impulse response coefficients of the liner filter embedded in the non-linear feedback loop of the modulator, and the operation $P_2$ implemented as $$P_2(s) = \sum_i Hb_i \cdot (b|H^THb)_{i,j}^{-1} \cdot (Hb_j|s),$$

where signal vectors $b_i=(b_i(0), \ldots, b_i(N-1))$ indicate base signals of a sub-space of band-limited signals in a space of all input signals of the modulator, where H indicates a matrix of impulse response coefficients of the linear filter embedded into the non-linear feedback loop of the modulator, where the symbol | indicates a Euclidean scalar product on a space of the signal vectors and where $(b|HTHb)_{i,j}^{-1}$ indicates coefficients of the inverse matrix of scaler products $(b_q|H^THb_r)$;

representing signals s by components s(n), s(n−1), s(n−2), ..., s(n−k) that are temporal samples of said signals s;

the operation $P_1$ being a projection in a space of all input signals of the modulator onto a set of all of input signals that the modulator images onto an output signal to be decoded;

the operation $P_2$ being a projection onto a sub-space of all input signals of the modulator whose frequency spectrum is limited in a predetermined manner; and selecting a representation of the input signals for both operations wherein the operation $P_1$ is implemented component-by-component, so that each component $P_1$ (s)(k) of $P_1$ (s) is calculated separately from all other components $P_1$ (s)(k') where k'≠k.

8. The method according to claim 7 wherein a temporally under-sampled output signal of the modulator is decoded.

9. The method according to claim 8 wherein the under-sampling of the output signal is controlled by a quantization error of the modulator.

10. A method for fast decoding of output signals of sigma delta modulators comprising the steps of:

acquiring a decoded output signal of a modulator, using a sequence $x_{n+1}=P_2(P_1(a \cdot x_n+(1-\alpha) \cdot x_{n-1}))$ steps, whereby $x_0$ is a predetermined start signal, the parameter $\alpha$ being selected in the implementation of the operation $P_1$;

successively implementing two operations $P_1$ and $P_2$ in each of said iteration steps;

representing signals s by components s(n), s(n−1), s(n−2), ..., s(n−k) that are temporal samples of said signal s;

the operation $P_1$ being a projection in a space of all input signals of the modulator onto a set of all input signals that the modulator images onto an output signal to be decoded;

the operation $P_2$ being a projection onto a sub-space of all input signals of the modulator whose frequency spectrum is limited in a predetermined manner; and selecting a representation of the input signals for both operations wherein the operation $P_1$ is implemented component-by-component, so that each component $P_1$ (s)(k) of $P_1$ (s) is calculated separately from all other components $P_1$ (s)(k') where k'≠k.

11. The method according to claim 10, wherein the modulator has a non-linear feedback loop with an embedded linear filter and wherein the operation $P_1$ is implemented according to the rule $$P_1(x_n)(k) = \left[ \begin{array}{c} x_n(k) \text{ when } y(k) \cdot x_n(k) \leq y(k) \cdot (Hy)(k) \\ (Hy)(k) \text{ otherwise} \end{array} \right],$$

where y is a vector $y=(y(0), \ldots, y(N-1))$ of the output signal of the modulator to be decoded, and $$H = \begin{bmatrix} h_1 & 0 & \ldots & 0 & 0 \\ h_2 & h_1 & \ldots & 0 & 0 \\ . & . & & . & . \\ . & . & & . & . \\ . & . & & . & . \\ h_{N-1} & h_{N-2} & \ldots & h_1 & 0 \\ h_N & h_{N-1} & \ldots & h_2 & h_1 \end{bmatrix}$$

is a matrix of impulse response coefficients of the linear filter embedded in the non-linear feedback loop of the modulator.

12. The method according to claim 11, wherein the operation $P_2$ is implemented as follows:

$$P_2(s) = \sum_i Hb_i \cdot (b|H^THb)_{i,j}^{-1} \cdot (Hb_j|s),$$

where signal vectors $b_i=(b_i(0), \ldots, b_i(N-1))$ indicate base signals of a sub-space of band-limited signals in a space of all input signals of the modulator, where H indicates a matrix of a pulse reply coefficient of the linear filter embedded into the non-linear feedback loop of the modulator, where the symbol | indicates a Euclidean scalar product on a space of the signal vectors and where $(b|HTHb)_{i,j}^{-1}$ indicates coefficients of the inverse matrix of scaler products $(b_q|H^THb_r)$.

13. The method according to claim 11, wherein a temporally under-sampled output signal of the modulator is decoded.

14. The method according to claim 13, wherein the under sampling of the output signal is controlled by a quantization error of the modulator.

* * * * *